United States Patent
Kim

(10) Patent No.: US 7,590,014 B2
(45) Date of Patent: Sep. 15, 2009

(54) SEMICONDUCTOR MEMORY DEVICE WITH MIRROR FUNCTION MODULE AND USING THE SAME

(75) Inventor: Young Ju Kim, Daejeon (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 27 days.

(21) Appl. No.: 11/778,154

(22) Filed: Jul. 16, 2007

(65) Prior Publication Data

US 2008/0159027 A1 Jul. 3, 2008

(30) Foreign Application Priority Data

Dec. 28, 2006  (KR) .................. 10-2006-0137166

(51) Int. Cl.
 *G11C 7/00* (2006.01)
(52) U.S. Cl. .............. 365/194; 365/189.17; 365/191; 365/193
(58) Field of Classification Search ............ 365/189.17, 365/191, 193, 194
See application file for complete search history.

(56) References Cited

U.S. PATENT DOCUMENTS 5,048,055 A * 9/1991 Creigh et al. ............... 375/229
6,614,714 B2 * 9/2003 Hsu et al. ............... 365/189.17
7,437,500 B2 * 10/2008 Butt et al. ................. 711/105
7,450,440 B2 * 11/2008 Kim et al. ............. 365/189.17

FOREIGN PATENT DOCUMENTS

KR   100172389 B1   10/1998

* cited by examiner

Primary Examiner—Ly D Pham
(74) Attorney, Agent, or Firm—Ladas & Parry LLP

(57) ABSTRACT

A semiconductor memory device with a mirror function enables two memory devices such as two DRAMs to share the same address and control signals. A pair of semiconductor memory devices are mounted on both sides of a substrate to be symmetrical to each other. A mirror function transfers a first transmission signal and a second transmission signal input on respective pads to any one of a mirror "on" path and a mirror "off" path. The mirror function can vary or reduce path delay differences between the mirror function "on" path and the mirror function "off" path by means of the delay and the mixture of phases in the semiconductor memory device, and reduce skew occurred in the operation of the mirror function.

26 Claims, 4 Drawing Sheets

SEMICONDUCTOR MEMORY DEVICE WITH MIRROR FUNCTION MODULE AND USING THE SAME

CROSS-REFERENCE TO RELATED APPLICATIONS

The present application claims priority to Korean patent application number 10-2006-0137166 filed on Dec. 28, 2006, which is incorporated herein by reference in its entirety.

BACKGROUND OF THE INVENTION

The present invention relates to a semiconductor device, and more particularly to a semiconductor memory device with a mirror function and a module mounting thereof.

In general, a dynamic random access memory or DRAM is typically manufactured in a module as a so-called Double In-line Memory Module (DIMM) or a module with a shape where DRAM device is mounted on both sides of a substrate.

DIMM modules mounted with DRAM on both sides of a substrate generally have DRAMs that both use the same signal lines, such as the address and control lines in common with each other. The pin (pad) to which commonly used signals (for being used in common by DRAM packages on both sides of the substrate) should be arranged so that they are symmetrical to each other at a package level. For such an arrangement relation, a mirror function is provided in the DRAM.

For example, it is proposed that a column address strobe signal /CAS and a chip selection signal /CS are input through two pads symmetrical to each other, and the conventional mirror function corresponding to this case will be described with reference to FIG. 1.

A mirror signal MF, determines whether a mirror function is on or off a transmission path of the column address strobe signal /CAS and the chip selection chip /CS output from the respective buffers 10 and 20 is also selected. The respective selectors 30 and 40 transfer signals to mirror function "on" paths MF_ON0 and MF_ON1 or mirror function "off" path "off" paths MF_OFF0 and MF_OFF1 by means of the mirror signal MF.

In other words, when the mirror function is active, any one of two memory chips attached to both sides of the substrate transfers the column address strobe signal /CAS and the chip selection signal ICS to the mirror function "off" path "off" paths MF_OFF0 and MF_OFF1, respectively, and the other transfers the chip selection signal /CS and the column address strobe signal /CAS and to the mirror function "on" paths MF_ON0 and MF_ON1, respectively.

The column address strobe signal /CAS and the chip selection signal /CS input through the respective pads should be transferred up to a transfer position, having the same delay time at the time of "on" function and the "off" mirror function. When the same delay time is applied to the two signals, no skew is generated as compared to external signals.

In laying out a semiconductor memory device, it is difficult to lay out the lines corresponding to the mirror function "off" paths MF_OFF0 and MF_OFF1 and the mirror function "on" paths MF_ON0 and MF_ON1 to have the same electrical length with each other.

Although the mirror function "off" paths MF_OFF0 and MF_OFF1 and the mirror function "on" paths MF_ON0 and MF_ON1 are laid-out so that they have the same physical length, a signal propagation delay difference nevertheless occurs between the signals applied to the mirror function "on" paths and the mirror function "off" paths because of parasitic capacitor or parasitic resistance so that the skew or propagation delay differences can occur due to the delay difference.

The resulting skew generates the difference between a setup/hold time forming a window of the signal, thereby deteriorating the setup/hold performance of the signal.

SUMMARY OF THE INVENTION

It is an object of the present invention to solve the delay difference generated between the signals transferred to mirror function "on" paths and mirror function "off" path "off" paths generated in a package with a mirror function, and to prevent skew occurrence between the signals.

In order to accomplish the above object, a semiconductor memory device according to the present invention comprises: a selector selecting and outputting any one of a first transmission signal transferred through a mirror "off" path and a second transmission signal transferred through a mirror "on" path, according to whether or not a mirror function is selected; and a mirror "off" circuit providing the mirror "off" path "off" path, delaying and transferring the first transmission signal by applying the delay time by modeling the required time that the second transmission signal arrives at the selector through the mirror "on" path to the first transmission signal and, and controlling the phase of the first transmission signal delay transferred according to a preset weight signal.

Also, a semiconductor memory device according to the present invention comprises: a first selector selecting and outputting any one of a first transmission signal and a second transmission signal transferred through a first mirror "on" path, according to whether or not a mirror function is applied; a second selector selecting and outputting any one of the first transmission signal and the second transmission signal transferred through a second mirror "on" path, according to whether or not a mirror function is applied; a first mirror off circuit providing a first mirror function "off" path "off" path transferring the first transmission signal to the first selector, and delaying the transfer of the first transmission signal by modeling the required time that the second transmission signal arrives at the first selector through the first mirror "on" path; and a second mirror off circuit providing a second mirror function "off" path "off" path transferring the second transmission signal to the second selector, and delaying the transfer of the second transmission signal by modeling the required time that the first transmission signal arrives at the second selector through the second mirror "on" path.

Herein, preferably, the first transmission signal and the second transmission signal are the signals input to a position symmetrical to each other based on a center line of a package.

And, the first mirror "off" circuit may comprise a delay unit delaying the transfer of the first transmission signal by modeling the required time that the second transmission signal arrives at the first selector through the first mirror "on" path; and a phase mixer mixing the phase of the output signal of the delay unit with the phase of the first transmission signal and controlling the mixture of phases according to a first weight.

Herein, the phase mixer may comprise: a first edge controller capable of controlling the skew of the signal with the mixed phase according to a first weight signal and controlling the rising and falling time of the output signal of the delay unit according to the first weight signal; a second edge controller controlling the rising and falling time of the first transmission signal according to the first weight signal; and a mixer mixing and outputting the output signals of the first and second edge controllers.

Herein, preferably, each of the first and second edge controllers comprises the same number of parallel-coupled three-phase inverters. The three-phase inverters operate to be contrary to each other according to the second weight signal.

And, the second mirror "off" circuit may comprise a delay unit delaying the transfer of the second transmission signal by modeling the required time that the first transmission signal arrives at the second selector through the second mirror "on" path; and a phase mixer mixing the phase of the output signal of the delay unit with the phase of the second transmission signal and controlling the mixture of phases according to a second weight.

Herein, the phase mixer may comprise: a first edge controller capable of controlling skew of the signals with the phase mixed using the second weight and controlling the rising and falling time of the output signal of the delay unit according to the second weight; a second edge controller controlling the rising and falling time of the second transmission signal according to the second weight signal; and a mixer mixing and outputting the output signals of the first and second edge controllers.

Herein, preferably, each of the first and second edge controllers comprises the same number of parallel-coupled three-phase inverters and the three-phase inverters operate to be contrary to each other according to the weight signal.

Meanwhile, a semiconductor memory module according to the present invention has at least a pair of semiconductor memory devices mounted on both sides of a substrate to be symmetrical to each other, the semiconductor memory devices inputting at least a first transmission signal and a second transmission signal used in common to pads arranged to be symmetrical to each other at a package level and providing a mirror function transferring the first transmission signal and the second transmission signal input to the respective pads to any one of a mirror "on" path and a mirror "off" path "off" path for themselves, and the respective semiconductor memory devices being constituted by DRAMs, the respective DRAMs comprise: a first selector selecting and outputting any one of the first transmission signal and the second transmission signal transferred through a first mirror "on" path, according to whether or not a mirror function is applied; a second selector selecting and outputting any one of the first transmission signal and the second transmission signal transferred through a second mirror "on" path, according to whether or not a mirror function is applied; a first mirror off circuit providing a first mirror function "off" path "off" path transferring the first transmission signal to the first selector, and delaying the transfer of the first transmission signal by modeling the required time that the second transmission signal arrives at the first selector through the first mirror "on" path; and a second mirror off circuit providing a second mirror function "off" path "off" path transferring the second transmission signal to the second selector, and delaying the transfer of the second transmission signal by modeling the required time that the first transmission signal arrives at the second selector through the second mirror "on" path.

Herein, the first mirror "off" circuit may comprise a delay unit delaying the transfer of the first transmission signal by modeling the required time that the second transmission signal arrives at the first selector through the first mirror "on" path; and a phase mixer mixing the phase of the output signal of the delay unit with the phase of the first transmission signal and controlling the mixture of phases according to a first weight signal.

Herein, the first mirror "off" circuit may comprise: a first edge controller controlling the rising and falling time of the output signal of the delay unit according to the first weight; a second edge controller controlling the rising and falling time of the first transmission signal according to the first weight; and a mixer mixing and outputting the output signals of the first and second edge controllers.

And, each of the first and second edge controllers may comprise the same number of parallel-coupled three-phase inverters and the three-phase inverters operate to be contrary to each other according to the second weight signal.

And, the second mirror off circuit may comprise a delay unit delaying the transfer of the second transmission signal by modeling the required time that the first transmission signal arrives at the second selector through the second mirror "on" path; and a phase mixer mixing the phase of the output signal of the delay unit with the phase of the second transmission signal and controlling the phase mixture according to a second weight signal.

Herein, the phase mixer may comprise: a first edge controller capable of controlling skew of the signals with the phase mixed using the second weight signal and controlling the rising and falling time of the output signal of the delay unit according to the second weight signal; a second edge controller controlling the rising and falling time of the second transmission signal according to the second weight; and a mixer mixing and outputting the output signals of the first and second edge controllers.

Herein, preferably, each of the first and second edge controllers comprises the same number of parallel-coupled three-phase inverters and the three-phase inverters operate to be contrary to each other according to the weight.

DESCRIPTION OF SPECIFIC EMBODIMENTS

Hereinafter, preferred embodiments of the present invention will be described in detail with reference to the accompanying drawings.

The present invention can be applied to a memory module mounted with at least a pair of semiconductor memory devices on opposing sides of a substrate such that contacts or leads of the pair of semiconductor memory devices are symmetrical to each other to allow inputting a first transmission signal and second transmission signal used in common to the pads arranged to be symmetrical to each other and providing a mirror function that the first transmission signal and the second transmission signal input to the respective pads are transferred to any one of a mirror "on" path and a mirror "off" path "off" path for itself.

The semiconductor memory device mounted on the module can be formed of DRAMs, each DRAM providing the mirror function, delaying the transmission signals to be identical or similar to each other on a mirror function "on" path and a mirror function "off" path by means of the mirror function, and finely controlling skew.

Figure 1:
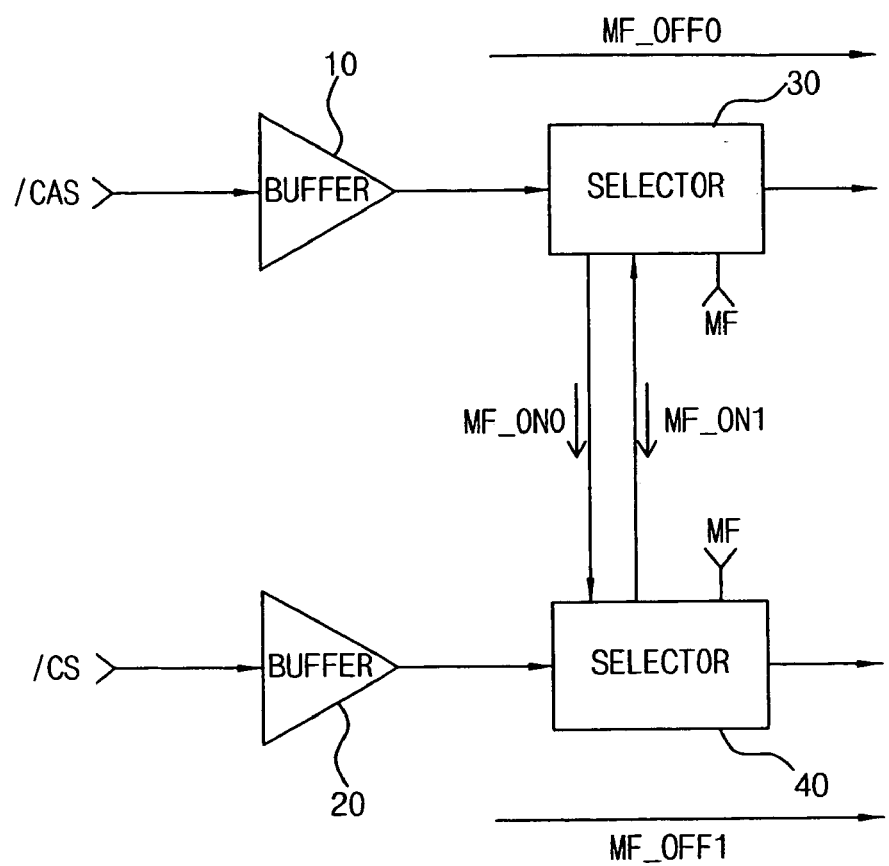
FIG. 1 is a circuit view showing any one of two memory chips attached to both sides of a substrate in a conventional semiconductor memory device with a mirror function.
Figure 2:
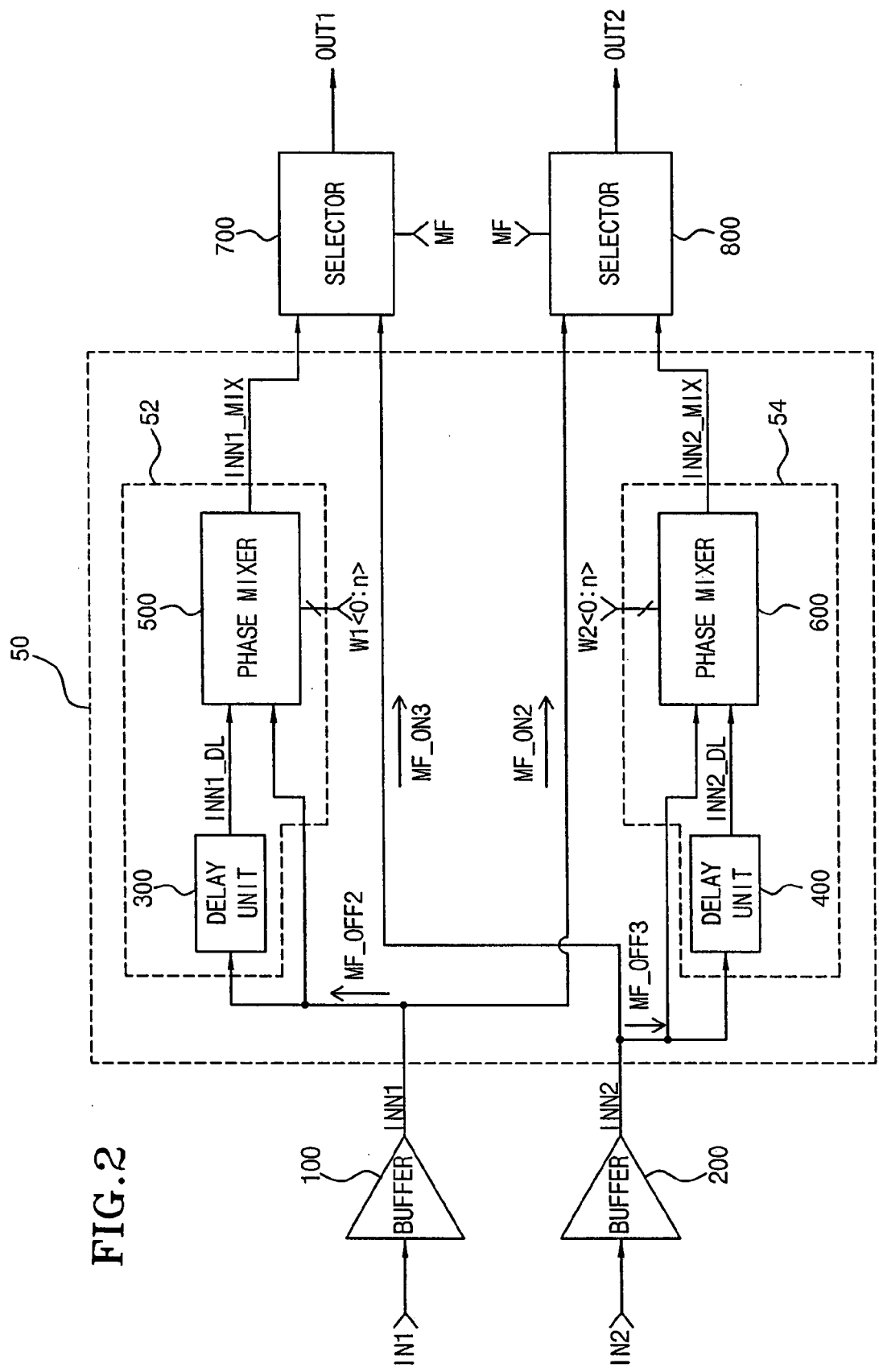
FIG. 2 is a circuit view showing any one of two memory chips attached to both sides of a substrate in a semiconductor memory device with a mirror function according to the present invention.

As shown in FIG. 2, the semiconductor memory device according to the present invention comprises buffers 100 and 200, delay units 300 and 400, phase mixers 500 and 600, selectors 700 and 800.

The delay units 300 and 400 and the phase mixers 500 and 600 form a skew controller 50. The skew controller 50 comprises two skew compensators, 52 and 54. Skew compensator 52 is comprised of the delay unit 300 and the phase mixer 500. Skew compensator 54 is comprised of the delay unit 400 and the phase mixer 600.

Herein, FIG. 2 shows only any one of two memory chips attached to both sides of the substrate, and the other memory chip also has the same constitution as FIG. 2.

The buffer 100 buffers an external signal IN1 transferred on the first transmission position to output it to an internal signal INN1, and the buffer 200 buffers an external signal IN2 transferred on the second transmission position to output it to an internal signal INN2.

The two external signals IN1 and IN2 are input to the two pads arranged to be symmetrical to each other at a package level, that is, to be symmetrical to each other based on a center line of the package. The signal IN1 is a column address strobe signal /CAS whereas signal IN2 is a chip selection signal /CS.

The internal signals INN1 and INN2 output from buffer 100 and the buffer 200 respectively, are inverted forms of the /CAS and /CS signals. In other words, INN1 corresponds to CAS and INN2 corresponds to CS. Both INN1 and INN2 are coupled to the mirror function "off" paths, MF_OFF2 and MF_OFF3 but also to the mirror function "on" paths MF_ON2 and MF_ON3.

The mirror function "off" path MF_OFF2 is coupled to the delay unit 300 and the phase mixer 500. The mirror function "off" path MF_OFF3 is coupled to the delay unit 400 and the phase mixer 600.

The delay unit 300 delays the internal signal INN1 on the mirror function "off" path MF_OFF2 to output the INN1 signal as a delay signal, INN1_DL. The delay unit 400 delays the internal signal INN2 on the mirror function "off" path MF_OFF3 to output the INN2 signal as a delay signal, INN2_DL.

The delay unit 300 holds or delays the internal signal INN1 until the internal signal INN2 is transferred to the selector 700, via the mirror function "on" path MF_ON3. The propagation delay time provided by the delay unit 300 can be effectuated by resistances and capacitances, etc.

The delay unit 400 delays the internal signal INN2 until the internal signal INN1 is transferred to the selector 800 via the mirror function "on" path MF_ON2. The propagation delay provided by the delay unit 400 can also be provided by elements such as resistance and capacitor, etc.

The phase mixer 500 mixes the delay signal INN1_DL output from the delay unit 300, which is a delayed form of the signal INN1, with the un-delayed signal INN1 and outputs a mixed signal INN1_MIX that is a combination of INN1_DL and INN1. Similarly, the phase mixer 600 mixes the delay signal INN2_DL output from the delay unit 400 with the phase of the internal signal INN2 to output it as a mixed signal INN2_MIX.

The respective phase mixers 500 and 600 control the mixture of the phases of the internal signal INN1 and the delay signal INN1_DL and the internal signal INN2 and the delay signal INN2_DL, according to the weight signals W1<0:n> and W2<0:n>, which are input to both phase mixers 500 and 600 as shown in FIG. 2.

Since the phase mixer 500 and the phase mixer 600 provide the same functionality, they can of course be constructed the same way.

Figure 3:
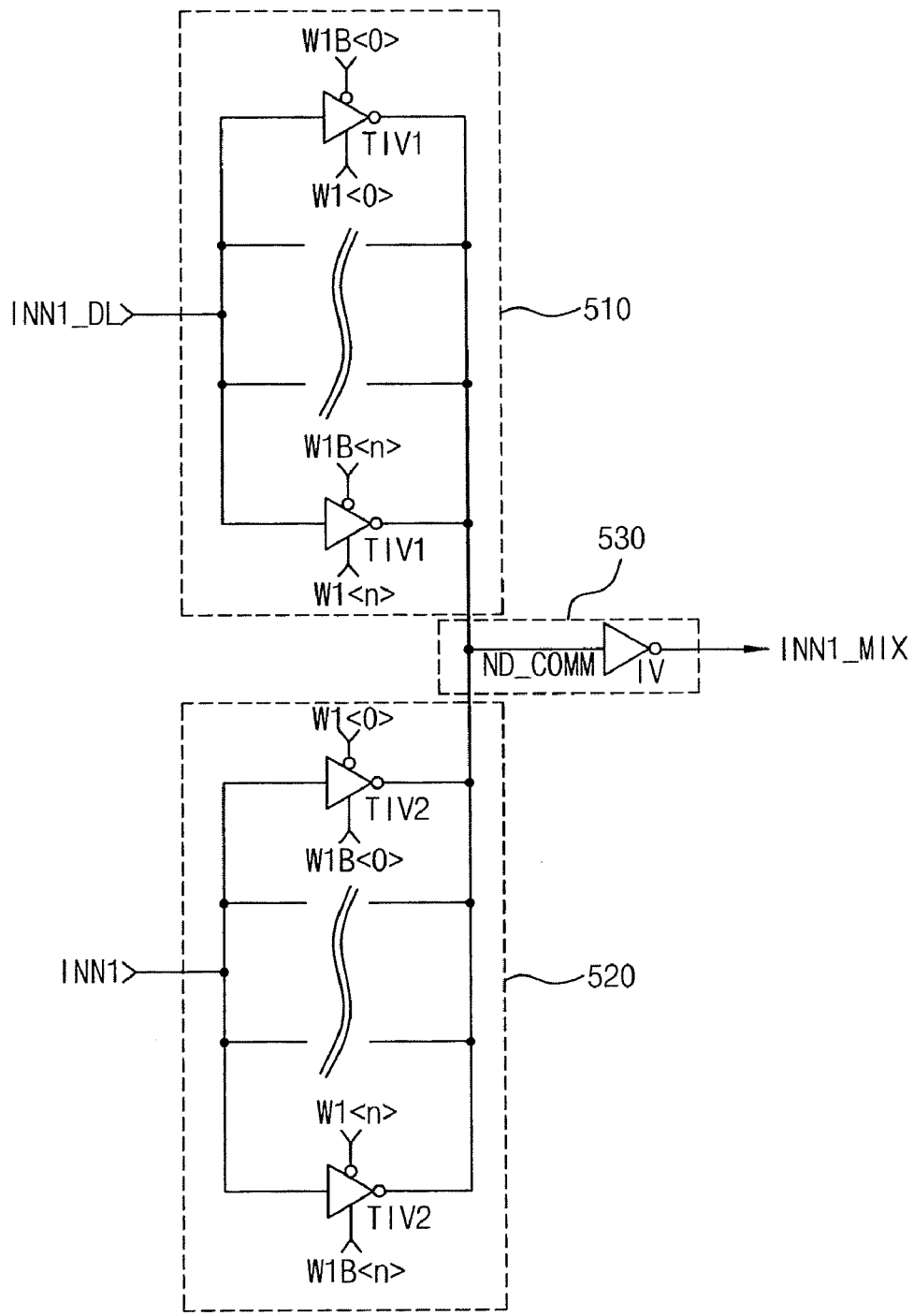
FIG. 3 is a circuit view showing one example of a phase mixer of FIG. 2.

FIG. 3 depicts one embodiment of a phase mixer that can be used to implement phase mixers 500 and 600. The phase mixer 500 of FIG. 3 comprises an edge controller 510 controlling the rising and falling time of the delay signal INN1_DL according to the state or values the weight signals W1<0:n>. An edge controller 520 controls the rise time and fall time of the internal signal INN1 on the mirror function "off" path MF_OFF2 according to the weight signals W1<0:n>. A signal mixer 530 outputs the mixed signal INN1_MIX by combining, i.e., mixing, the signals output from the two edge controllers 510 and 520. In FIG. 3, the weight signal W1B<0:n> indicates a signal with the phase opposed to the phase of W1<0:n>.

The edge controller 510 can be construed using a plurality of three-phase inverters TIV1, which are configured as shown in FIG. 3 to selectively invert and output the delay signal INN1_DL according to the state of the weight signals W1<0:n>.

The edge controller 520 can also be constructed using a plurality of three-phase inverters TIV2, which are also configured as shown in FIG. 3 to selectively invert and output the internal signal INN1 according to the state of the weight signals W1<0:n>.

The respective three-phase inverters TIV1 and TIV2 of the two edge controllers 510 and 520 operate to be contrary to each other. By way of example, in the case where the respective edge controllers 510 and 520 are comprised of the three three-phase inverters TIV1 and TIV2, if two, three-phase inverters TIV1 in the edge controller 510 are turned-on according to the weight signals W1<0:1>, then one three-phase inverter TIV2 in the edge controller 520 is turned-on according to the weight W1<2>.

The values of the weight signals W1<0:n> controlling the driving of the respective three-phase inverters TIV1 and TIV2 can be set to have desired delays. As one example, the weight signals W1<0:n> can be determined according to the results testing the difference in delay time between the signal transferred to the selector 700 without phase-mixing the delay signal INN1_DL and the internal signal INN2 transferred to the selector 700 via the mirror function "on" path MF_ON3.

The signal mixer 530 can be constructed using an inverter IV (or buffer in alternate embodiments). The edge controller 510 and 520 outputs can be simply tied together to form a common node ND_COMM, which is coupled to the inverter IV input. The signal output from the inverter IV is the mixed signal INN1_MIX.

Figure 4:
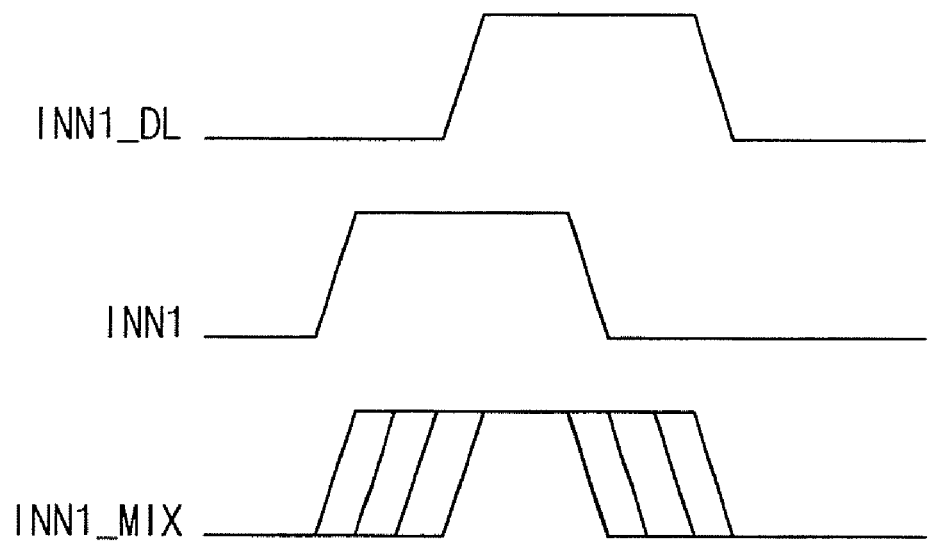
FIG. 4 is a waveform view for explaining the operation of FIG. 3.

FIG. 4 depicts the relationship between the delay signal INN1_DL and the internal signal INN1, which are mixed together according to weight signals having values that are contrary to each other according to the state of the weight signals W1<0:n>.

If each edge controller 510 and 520 is constructed using two, three-phase inverters TIV1 and TIV2 and only the weight signal W1<0> of the weight signals W1<0:3> is enabled, the mixed signal INN1_MIX has an oblique phase toward the internal signal INN1 between the phases of the delay signal INN1_DL and the internal signal INN1.

Referring again to FIG. 2, the selector 700 is constructed so that it outputs a signal OUT1 by selecting either one of the mixed signal INN1_MIX and the internal signal INN2 on the mirror function "on" path MF_ON3 according to the mirror signal MF, which determines whether or not the mirror function is to be provided. The selector 800 is similarly constructed in that it outputs a signal OUT2 by selecting any one of the mixed signal INN2_MIX and the INN1 transferred to the mirror function "on" path MF_ON2 according to the mirror signal MF.

Hereinafter, the operation of the mirror function in the semiconductor memory device according to the present invention will be described with reference to FIG. 2.

When the mirror function is on, the external signal IN1 is output from the buffer 100 as the internal signal INN1 and provided to the selector 800 on the mirror function "on" path MF_ON2. Then, the transferred signal is output as the signal OUT2 by means of the selection of the selector 800.

When the mirror function is on, the external signal IN2 is output as the internal signal INN2 from the buffer 200 and transferred to the selector 700 via the mirror function "on" path MF_ON3. Then, the transferred signal is output as the signal OUT1 by means of the selection of the selector 700.

When the mirror function is off, the external signal IN1 is output as the internal signal INN1 from the buffer 100 and is output as the signal OUT1 via the delay unit 300, the phase mixer 500, and the selector 700.

When the mirror function is off, the external signal IN2 is output as the internal signal INN2 from the buffer 200 and is output as the signal OUT2 via the delay unit 400, the phase mixer 600, and the selector 800.

When the mirror function is off, the external signal IN1 is buffered via the buffer 100 and then is delayed corresponding to the delay time of the mirror function "on" path MF_ON3, by means of the delay unit 300. And, the delay signal INN1_DL in the phase mixer 500 is output as the mixed signal INN1_MIX by being mixed with the internal signal INN1 by means of the weight signals W1<0:n>.

Likewise, in the state where the mirror function is off, the external signal IN2 is buffered through the buffer 200 and then is delayed corresponding to the delay time of the mirror function "on" path MF_ON2 by means of the delay unit 400. And, the delay signal INN2_DL in the phase mixer 600 is output as the mixed signal INN2_MIX by being mixed with the internal signal INN2 by means of the weight signals W2<0:n>.

Since the mirror function is the off state, the selector 700 selects the mixed signal INN1_MIX by means of the mirror signal MF to output it as the signal OUT1 and the selector 800 selects the mixed signal INN2_MIX by means of the mirror signal MF to output it as the signal OUT2.

When the mirror function is off as above, it is the mixed signal INN1_MIX output through the delay unit 300 and the phase mixer 500 that the delay time applied to the mirror function "on" path MF_ON3 is the same as the delay time applied to the internal signal INN1. Also, it is the mixed signal INN2_MIX output through the delay unit 400 and the phase mixer 600 that the delay time applied to the mirror function "on" path MF_ON2 is the same as the delay time applied to the internal signal INN2.

That is, the delay time of the two delay units 300 and 400 and the two phase mixer 500 and 600 is controlled so that the mirror function "off" path MF_OFF2 and the mirror function "on" path MF_ON3, and the mirror "off" path MF_OFF3 and the mirror function "on" path MF_ON2, respectively, have the same delay time.

Accordingly, when the mirror function is on, the signals OUT1 and OUT2 output from each of the two selectors 700 and 800 and the signals OUT1 and OUT 2 output from each of the two selectors 700 and 800 are the same delay time so that the skew is reduced by means of the operation of the mirror function.

As above, the present invention can reduce the delay difference between the mirror function "on" path and the mirror function "off" path by means of the predetermined delay and the mixture of phases in the semiconductor memory device with a mirror function and reduce the skew generated when the mirror function operates.

Those skilled in the art will appreciate that the specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

What is claimed is:

1. A semiconductor memory device comprising:
   a selector selecting and outputting any one of a first transmission signal transferred through a mirror "off" path and a second transmission signal transferred through a mirror "on" path, according to whether or not a mirror function is applied; and
   a mirror "off" circuit providing the mirror "off" path, delaying and transferring the first transmission signal by applying the delay time by modeling the required time that the second transmission signal arrives at the selector through the mirror "on" path to the first transmission signal, and controlling the phase of the first transmission signal delayed and transferred according to preset weight signal.

2. The semiconductor memory device as set forth in claim 1, wherein the first mirror "off" circuit comprise:
   a delay unit delaying the transfer of the first transmission signal by the time corresponding to the delay time by modeling the required time that the second transmission signal arrives at the selector through the mirror "on" path; and
   a phase mixer mixing the phase of the output signal of the delay unit with the phase of the first transmission signal and controlling the mixture of phases according to the weight.

3. The semiconductor memory device as set forth in claim 2, wherein the phase mixer controls the skew of the signal with the mixed phase according to the weight signal.

4. The semiconductor memory device as set forth in claim 2, wherein the phase mixer comprises:
   a first edge controller controlling the rising and falling time of the output signal of the delay unit according to the weight signal;
   a second edge controller controlling the rising and falling time of the first transmission signal according to the weight signal; and
   a mixer mixing and outputting the output signals of the first and second edge controllers.

5. The semiconductor memory device as set forth in claim 4, wherein each of the first and second edge controllers comprises the same number of parallel-coupled three-phase inverters and the three-phase inverters operate to be contrary to each other according to the first weight signal.

6. The semiconductor memory device as set forth in claim 4, wherein the mixer comprises a common node inputted with the output signal of the first edge controller and the output signal of the second edge controller and an inverter inverting the signals transferred to the common node.

7. The semiconductor memory device as set forth in claim 1, wherein the first transmission signal and the second transmission signal are the signals input to a position symmetrical to each other based on a center line of a package level.

8. A semiconductor memory device comprising:
   a first selector selecting and outputting any one of a first transmission signal and a second transmission signal transferred through a first mirror "on" path, according to whether or not a mirror function is applied;

a second selector selecting and outputting any one of the first transmission signal and the second transmission signal transferred through a second mirror "on" path, according to whether or not a mirror function is applied;

a first mirror off circuit providing a first mirror function "off" path transferring the first transmission signal to the first selector, and delaying the transfer of the first transmission signal by modeling the required time that the second transmission signal arrives at the first selector through the first mirror "on" path; and a second mirror off circuit providing a second mirror function "off" path transferring the second transmission signal to the second selector, and delaying the transfer of the second transmission signal by modeling the required time that the first transmission signal arrives at the second selector through the second mirror "on" path.

9. The semiconductor memory device as set forth in claim 8, wherein the first transmission signal and the second transmission signal are the signals input to a position symmetrical to each other based on a center line of a package level.

10. The semiconductor memory device as set forth in claim 8, wherein the first mirror off circuit comprises:

a delay unit delaying the transfer of the first transmission signal by the time required for the second transmission signal to arrive at the first selector through the first mirror "on" path; and a phase mixer mixing the phase of the output signal of the delay unit with the phase of the first transmission signal and controlling the mixture of phases according to a first weight signal.

11. The semiconductor memory device as set forth in claim 10, wherein the phase mixer controls the skew of the signal with the mixed phase according to the first weight signal.

12. The semiconductor memory device as set forth in claim 10, wherein the phase mixer comprises:

a first edge controller controlling the rising and falling time of the output signal of the delay unit according to the first weight signal;

a second edge controller controlling the rising and falling time of the first transmission signal according to the first weight signal; and a mixer mixing and outputting the output signals of the first and second edge controllers.

13. The semiconductor memory device as set forth in claim 12, wherein each of the first and second edge controllers comprises the same number of parallel-coupled three-phase inverters and the three-phase inverters operate to be contrary to each other according to the second weight signal.

14. The semiconductor memory device as set forth in claim 8, wherein the second mirror off circuit comprises:

a delay unit delaying the transfer of the second transmission signal by modeling the required time that the first transmission signal arrives at the second selector through the second mirror "on" path; and a phase mixer mixing the phase of the output signal of the delay unit with the phase of the second transmission signal and controlling the mixture of phases according to the second weight signal.

15. The semiconductor memory device as set forth in claim 14, wherein the phase mixer controls the skew of the signal with the mixed phase according to the second weight signal.

16. The semiconductor memory device as set forth in claim 14, wherein the phase mixer comprises:

a first edge controller controlling the rising and falling time of the output signal of the delay unit according to the second weight signal;

a second edge controller controlling the rising and falling time of the second transmission signal according to the second weight signal; and a mixer mixing and outputting the output signals of the first and second edge controllers.

17. The semiconductor memory device as set forth in claim 16, wherein each of the first and second edge controllers comprises the same number of parallel-coupled three-phase inverters and the three-phase inverters operate to be contrary to each other according to the weight signal.

18. A semiconductor memory module having at least a pair of semiconductor memory devices mounted on both sides of a substrate to be symmetrical to each other, the semiconductor memory devices inputting at least a first transmission signal and a second transmission signal used in common to pads arranged to be symmetrical to each other at a package level and providing a mirror function transferring the first transmission signal and the second transmission signal input to the respective pads to any one of a mirror "on" path and a mirror "off" path for themselves, the respective semiconductor memory devices comprising:

a first selector selecting and outputting any one of the first transmission signal and the second transmission signal transferred through a first mirror "on" path, according to whether or not a mirror function is applied;

a second selector selecting and outputting any one of the first transmission signal and the second transmission signal transferred through a second mirror "on" path, according to whether or not a mirror function is applied;

a first mirror off circuit providing a first mirror function "off" path transferring the first transmission signal to the first selector, and delaying the transfer of the first transmission signal by modeling the required time that the second transmission signal arrives at the first selector through the first mirror "on" path; and a second mirror off circuit providing a second mirror function "off" path transferring the second transmission signal to the second selector, and delaying the transfer of the second transmission signal by modeling the required time that the first transmission signal arrives at the second selector through the second mirror "on" path.

19. The semiconductor memory module as set forth in 18, wherein, the first mirror off circuit comprises:

a delay unit delaying the transfer of the first transmission signal by modeling the required time that the second transmission signal arrives at the first selector through the first mirror "on" path; and a phase mixer mixing the phase of the output signal of the delay unit with the phase of the first transmission signal and controlling the mixture of phases according to a first weight signal.

20. The semiconductor memory module as set forth in claim 19, wherein the phase mixer comprises:

a first edge controller controlling the rising and falling time of the output signal of the delay unit according to the first weight signal;

a second edge controller controlling the rising and falling time of the first transmission signal according to the first weight signal; and a mixer mixing and outputting the output signals of the first and second edge controllers.

21. The semiconductor memory module as set forth in claim 20, wherein each of the first and second edge controllers comprises the same number of parallel-coupled three-phase inverters and the three-phase inverters operate to be contrary to each other according to the second weight signal.

22. The semiconductor memory module as set forth in claim 18, wherein the second mirror off circuit comprises:

a delay unit delaying the transfer of the second transmission signal by modeling the required time that the first transmission signal arrives at the second selector through the second mirror "on" path; and a phase mixer mixing the phase of the output signal of the delay unit with the phase of the second transmission signal and controlling the mixture of phases according to the second weight signal.

23. The semiconductor memory module as set forth in claim 22, wherein the phase mixer controls the skew of the signal with the mixed phase according to the second weight signal.

24. The semiconductor memory module as set forth in claim 22, wherein the phase mixer comprises:

a first edge controller controlling the rising and falling time of the output signal of the delay unit according to the second weight signal;

a second edge controller controlling the rising and falling time of the second transmission signal according to the second weight signal; and a mixer mixing and outputting the output signals of the first and second edge controllers.

25. The semiconductor memory module as set forth in claim 24, wherein each of the first and second edge controllers comprises the same number of parallel-coupled three-phase inverters and the three-phase inverters operate to be contrary to each other according to the weight signal.

26. The semiconductor memory module as set forth in claim 18, wherein the semiconductor memory device is constituted by DRAMs.

* * * * *